(12) United States Patent
Leith

(10) Patent No.: US 6,340,903 B1
(45) Date of Patent: Jan. 22, 2002

(54) AUTO-ZERO FEEDBACK SAMPLE-HOLD SYSTEM

(75) Inventor: James W. Leith, Seattle, WA (US)

(73) Assignee: Zilog, Ind., Campbell, CA (US)

( * ) Notice: Subject to any disclaimer, the term of this patent is extended or adjusted under 35 U.S.C. 154(b) by 0 days.

(21) Appl. No.: 09/567,948

(22) Filed: May 10, 2000

(51) Int. Cl.$^7$ .............................................. H03K 17/00
(52) U.S. Cl. .......................................... 327/94; 327/95
(58) Field of Search .............................. 327/94, 91, 93, 327/95, 336, 341, 345

(56) References Cited

U.S. PATENT DOCUMENTS

| | | | |
|---|---|---|---|
| 3,696,305 A | 10/1972 | Mitchell et al. | 330/51 |
| 4,119,960 A | 10/1978 | Hill | 330/51 |
| 4,302,689 A | 11/1981 | Brodie | 307/353 |
| 4,417,160 A | 11/1983 | Schade Jr. | 307/353 |
| 4,587,443 A | 5/1986 | van de Plassche | 307/353 |
| 4,962,323 A | 10/1990 | Ta | 307/350 |
| 5,177,382 A | 1/1993 | Kondo et al. | 307/320 |
| 5,182,522 A | 1/1993 | Tanigawa et al. | 328/167 |
| 5,297,424 A | 3/1994 | Sackett | 73/146.5 |
| H1616 H | 12/1996 | Wolfe | 348/18 |
| 5,648,738 A * | 7/1997 | Welland et al. | 327/307 |
| 5,977,803 A * | 11/1999 | Tsugai | 327/94 |
| 6,175,254 B1 * | 1/2001 | Corio | 327/94 |

FOREIGN PATENT DOCUMENTS

| | | |
|---|---|---|
| EP | 0273425 A2 | 7/1988 |
| GB | 2215544 A | 9/1989 |

OTHER PUBLICATIONS

Gasparik, F. (1980) "Session XI: Data Acquisition Components –THAM 11.2: An Autozeroing Sample and Hold IC " 1980 IEEE Solid State Circuits Conference Digest of Technical Papers, pp. 132–133.

(List continued on next page.)

Primary Examiner—Timothy P. Callahan
Assistant Examiner—Linh Nguyen
(74) Attorney, Agent, or Firm—Skjerven Morrill MacPherson LLP; Gerald P. Parsons; Michael G. Cleveland (57) ABSTRACT

A sample and hold circuit uses an auto-zero feedback technique to cancel the DC level of the input signal and reference this signal to a new baseline. The circuit is based on an op-amp with two separate feedback loops. The first feedback loop is connected to the same op-amp input as the incoming signal and contains a capacitor to store charge from this signal during sample mode and set the output voltage during hold mode. The second feedback loop uses an auto-zero feedback technique and contains an integrator having a predetermined reference voltage, thereby allowing the DC level of the input signal to removed without the need for capacitors in the gain path of the circuit. This allows the sample and hold circuit to extract an embedded time varying signal from the input voltage. It can be configured for a high gain, high pass function, without the need for large electrolytic capacitors in the gain path, removing the problems associated with such capacitors. An exemplary embodiment of a three stage circuit for extracting an embedded signal lying in a frequency range, but having an amplitude much smaller than the DC component of the analog signal within which it is embedded. An initial low gain section acts as a buffer before the sample and hold section. Following the sample and hold section, the circuit employs a stage with a high gain high pass function also using auto-zero feedback. This again eliminates the large electrolytic capacitors usually placed the gain path that can not be implemented as part of a single integrated circuit. Besides eliminating the need for off-chip capacitors in the gain path, by using auto-zero feedback all sample and hold errors are referenced to the output of the sample and hold stage and are not amplified by the total system in a multi-stage configuration as the offset voltages of the amplifiers are not amplified.

37 Claims, 4 Drawing Sheets

OTHER PUBLICATIONS

Gasparik, F. (1980) "A Precision Autozeroing Sample and Hold Integrated Circuit" *IEEE Journal of Solid–State Circuits*, SC–15(6):945–949.

Harris, F. et al. (1989) "New Results with Oversampled Converters" *Conference Record of the Twenty–third Asilomar Conference on Signals, Systems & Computers*, 2:844–848.

Hoskins, K. (1985) "Active Offset Correction Integrated in CMOS Technology" *Elektronik Industrie*, 16(6):96, 98, 100 and 102 (English language abstract provided).

Hribik, J. (1999) "Computer–To–Frequency Converters with Feedback" *Journal of Electrical Engineering*, 50(1–2):44–46.

Ishikawa, M. et al. (1989) "An 8–bit 50–MHz CMOS Subranging A/D Converter with Pipelined Wide–Band S/H" *IEEE Journal of Solid–State Circuits*, 24(6):1485–1491.

Kudo, M. et al. (1986) "A Proposal of Various Recursive Switched Capactor Filters Using a Single OP–Amp and Experimental Results" *Electronics and Communications in Japan*, Part 2, 69(2):84–92.

Matej, V. (1990) "A Ramp Generator" *Sdelovaci Technika*, 38(6):224–225 (English language abstract provided).

Real, P. et al. (1991) "TPM 10:1: A 14b Linear, 250ns Sample–and–Hold Subsystem with Self–Correction" *IEEE International Solid State Circuits Conference DIgest of Technical Papers*, pp. 164–165.

Shovak, A. et al. (1992) "Median–Based Offset Cancellation Circuit Technique" *1992 IEEE International Symposium on Circuits and System*, 4:2033–2036.

Signell, S. et al. (1989) "Offset–Compensatio of Two–Phase Switched–Capacitor Filters" *IEEE Transactions on Circuits and Systems*, 36(1):31–41.

Skribanowitz, G. (1990) Low Frequency Filter VF 30) *Radio Fernsehen Elektronik*, 39(91):35–37 (English language abstract provided).

Sone, K. et al. (1993) "A 10–b 100–Msample/s Pipelined Subranging BiCMOS ADC" *IEEE Journal of Solid–State Circuits*, 28(12):1180–1186.

Wiegerink, R. et al. (1989) 37 Offset cancelling Circuit) *IEEE Journal of Solid–State Circuits*, 24(3):651–658.

\* cited by examiner

AUTO-ZERO FEEDBACK SAMPLE-HOLD SYSTEM

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to sample and hold circuits and, more particularly, to a method and apparatus for extracting a time varying component of an analog signal while resetting the DC level of the signal to a new reference value.

2. Background Information

Sample and hold (S/H) stages are common in many analog circuits, for example in analog to digital converters and other applications where an analog signal needs to be sampled and held for some period of time. These circuits generally function by having a switch through which the input voltage which is to be sampled is supplied to the S/H circuit and a capacitor on which this sampled charge is stored. In the sample mode, the circuit output is derived from the input and the capacitor is charged. During the usually much longer hold mode, the output is based upon the changed placed on the capacitor by the input voltage during the brief sample mode.

Figure 1A:
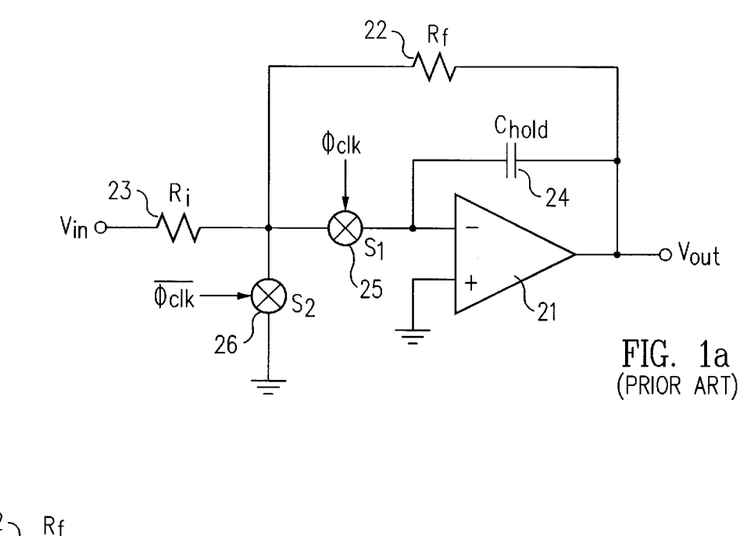
FIG. 1a is an example of one type of prior art sample and hold circuit.
Figure 1B:
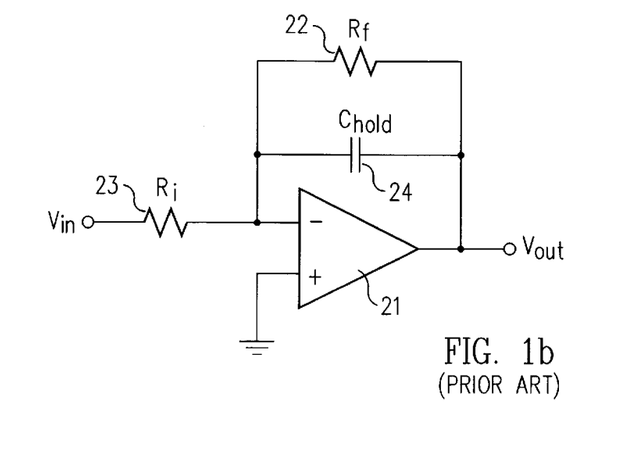
FIGS. 1b and 1c are equivalent circuits of FIG. 1a in, respectively, sample and hold mode.

An example of a prior art design is shown in FIG. 1a. In this particular design, the charge holding capacitor $C_{hold}$ 24 is part of a feedback loop to the same op-amp input that receives the input signal $V_{in}$, although a number of other placements can be found in other designs. This particular arrangement is an integrator-type S/H circuit. When switch $S_1$ 25 is closed and $S_2$ 26 is open, the circuit is in sample or track mode and charge accumulates on $C_{hold}$ 24. The equivalent circuit is shown in FIG. 1b. The DC gain is given by the ration of $R_f$ 22 to $R_i$ 23 and the overall transfer function is $V_{out} = -(R_f/R_i)(1sR_fC_{hold})^{-1}V_{in}$, where s is the Laplace transform parameter, so that it acts as an inverting low-pass circuit. The charge accumulated on $C_{hold}$ 24 is then proportional to $V_{out} = -(R_f/R_i)(V_{in}-V_+)$, where $V_+$ is the voltage at the non-inverting terminal of op-amp 21.

Figure 1C:
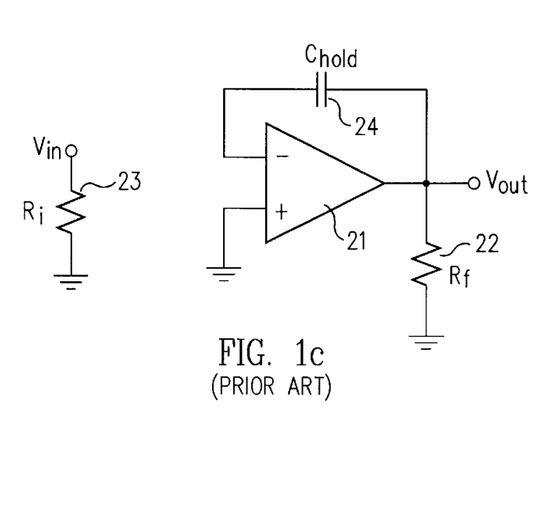

The equivalent circuit during hold mode is shown in FIG. 1c. $S_1$ 25 is open and $S_2$ 26 is closed, and $V_{out}$ is determined by the integrated charge stored on $C_{hold}$ 24 during the sample mode. $S_2$ 26 minimizes signal feedthrough when in hold mode and keeps the common node of the resistive network close to the voltage required when the circuit goes back to the sample mode.

One application of a sample and hold circuit is to extract a time varying component of an analog signal having a DC component of much greater amplitude than the time varying component. The circuit will need to pass and amplify the frequencies in the range of interest while at the same time largely removing any DC component. For example, if the circuit needs to extract a signal with a bandwidth of 10–1000 Hz embedded in an analog signal with a DC level several orders of magnitude larger this time varying portion, a S/H circuit as in FIG. 1 is inadequate: As a low pass filter, it will amplify the DC component (as well as any offset voltages passed on) more that the signal in the desired bandwidth; and if the resistors are chosen so that this bandwidth is amplified enough to be easily detectable, the DC level will have saturated the output thereby destroying any time varying component. Additionally, its low pass function makes it difficult to obtain a fast settling speed within acceptable values for the resistors and capacitor.

These problems can be reduced by giving the S/H circuit itself a high gain high pass filter function, combining it with additional stages high gain high pass sections, or both. The standard of doing this is to use a large capacitance either in place of, or in series with, the resistor $R_i$ 23 in FIG. 1a. If an additional amplification stage with a standard, non-S/H high pass high gain filter function is added, it would be similar to FIG. 1 a with the integrating capacitor $C_{hold}$ 24 and the switches $S_1$ 25 and $S_2$ 26 removed, but a large capacitor would still be needed in the gain path. Although this sort of arrangement may give the desired response characteristics, it produces a number of new problems, largely related to the need for the large electrolytic capacitors in the gain path of the circuit. Additionally, when a gain of several orders of magnitude is needed for the wanted signal, any stray offset voltages are similarly magnified.

Having large capacitors causes several problems as such capacitors are not readily incorporated into an integrated circuit. Prior art solutions thus involve using discreet S/H circuits, resistors/capacitors, and operational amplifiers. This results in the reliability problems associated with discreet solutions, such as board leakage around the (usually FET) S/H and failure of the large electrolytic AC coupling capacitors in the signal path. Use of discreet components also limits the reduction both of the number of components and of the required board area. Additionally, these large off-chip capacitors have problems in radiation due to a susceptibility to induced electromagnetic fields.

SUMMARY OF THE PRESENT INVENTION

The present invention provides a sample and hold circuit which uses an auto-zero feedback technique to cancel the DC level of the input signal and reference this signal to a new baseline. The circuit is based on an op-amp with two separate feedback loops. A first feedback loop is connected to the same op-amp input as the incoming signal and contains a capacitor to store charge from this signal during sample mode and set the output voltage during hold mode. The second feedback loop uses an auto-zero feedback technique and contains an integrator having a predetermined reference voltage, thereby allowing the DC level of the input signal to removed without the need for capacitors in the gain path of the circuit. This allows the sample and hold circuit to extract an embedded time varying signal from the input voltage. It can be configured for a high gain, high pass function, again without the need for large electrolytic capacitors in the gain path, removing the problems associated with such capacitors.

An exemplary embodiment is as a three stage circuit to extract an embedded signal lying in a frequency range, but having an amplitude much smaller than the DC component of the analog signal within which it is embedded. An initial low gain section acts as a buffer before the sample and hold section. Following the sample and hold section, the circuit employs a stage with a high gain high pass function also using auto-zero feedback. This again eliminates the large electrolytic capacitors usually placed in the gain path that can not be implemented as part of a single integrated circuit. Besides eliminating the need for off-chip capacitors in the gain path, by using auto-zero feedback all sample and hold errors are referenced to the output of the sample and hold stage and are not amplified by the total system in a multi-stage configuration as the offset voltages of the amplifiers are not amplified.

Additional objects, advantages, and features of the present invention will become apparent from the following description of its preferred embodiments, which description should be taken in conjunction with the accompanying drawings.

DETAILED DESCRIPTION OF THE INVENTION

Figure 2:
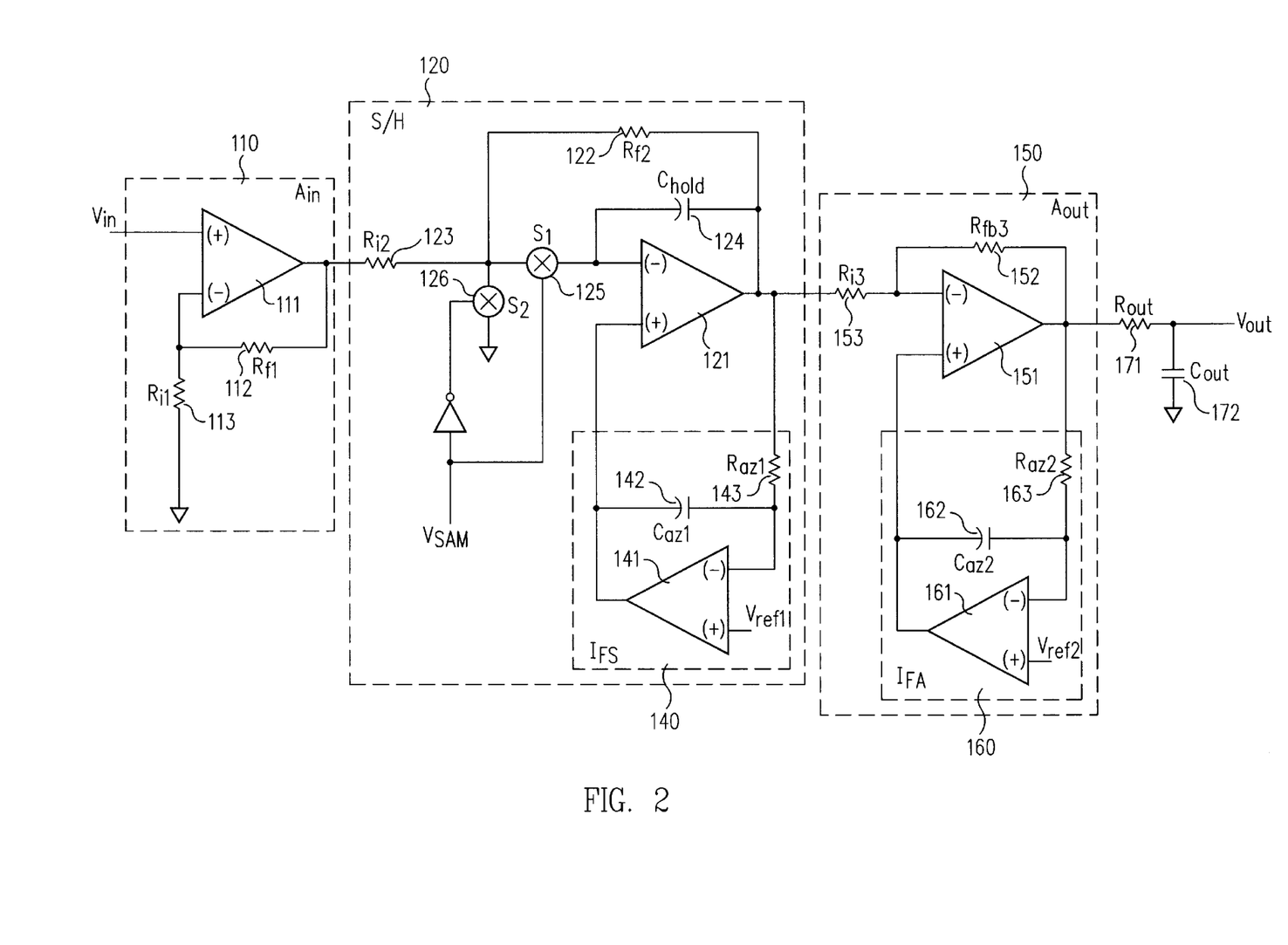
FIG. 2 is a multi-stage sample and hold circuit embodying the present invention.

FIG. 2 is a multistage sample and hold circuit embodying many aspects the present invention. This example is configured with three stages. The first stage is a non-inverting amplifier $A_{in}$ 110 to receive the input voltage $V_{in}$. The second stage is the sample and hold section S/H 120. The last stage is the amplifier circuit $A_{out}$ 150. Both the sample and hold section S/H 120 and the subsequent stage $A_{out}$ 150 receive the input from the preceding section through the inverting inputs of their respective op-amps 121 and 151, both of which are also connected in a feed back loop. Both S/H 120 and $A_{out}$ 150 have an additional feedback loop with an integrator, $I_{fs}$ 140 and $I_{fa}$ 160 respectively, into the non-inverting input of their respective op-amps. As described below, the inclusion of this second, auto-zero feedback loop cancels the DC level of the preceding sections and references the signal to a new baseline. As arranged in FIG. 2, this circuit can extract a small time varying component from an analog signal having a much larger constant voltage.

First, circuit $A_{out}$ 150 is described, as it is similar to the sample and hold section S/H 120 but simpler. A discussion of the sample and hold section is then given, followed by the operation of the circuit as a whole.

In $A_{out}$ 150, op-amp 151 receives the output of the preceding stage S/H 120 into the inverting output through resistor $R_{i3}$ 153. Feedback resistor $R_{f3}$ 152 connects this input to the output and the gain is proportional to the ratio of these two resistors. A second feedback loop is connected back to the second, non-inverting input of op-amp 151. This second feedback loop is based on an integrator $I_{fa}$ 160 with a predetermined reference voltage $V_{ref2}$. The integrator $I_{fa}$ 160 is composed of a second op-amp 161 whose inverting input is connected to the output of the first op-amp 151 through resistor $R_{az2}$ 163, with capacitor $C_{az2}$ 162 in the feedback loop to provide the integration function. The predetermined reference voltage $V_{ref2}$ is supplied to the non-inverting input and the output goes back to the non-inverting input of op-amp 151 to close the second feedback loop. The reference voltage $V_{ref2}$ can either be fixed or adjustable, in either case by a resistive voltage divider or other standard technique. As discussed below, a convenient choice for the present application is $V_{ref2}=1/2V_{dd}$.

The transfer function of $A_{out}$ 150 is given by $$V_{out} = -\left(\frac{R_f}{R_i}\right)\left(\frac{s\alpha}{s\beta+1}\right)V_{in} + \frac{1}{s\beta+1}V_{ref} + \frac{s\alpha}{s\beta+1}V_{ref},$$

where $\alpha=R_{az}C_{az}$, $\beta=\alpha R_i/(R_i+R_f)$, s is the Laplace transform parameter, and the minus sign is due to the inverting gain topology used. Due to the first term in $V_{out}$, $A_{out}$ 150 provides a high gain, high pass function. As both it and the last term go to zero for s=0, any DC offset from the previous stage is removed. The second term then references the output to a new base line of $V_{ref2}$. Note that in addition to removing any DC component from the previous stage, it can also cancel any other offset voltages that would otherwise be introduced.

The use of the second feed back loop serves several purposes. First, it turns $A_{out}$ 150 into a high pass filter since the expression in brackets goes to zero as $sR_{az2}C_{az2}$ for low frequencies and becomes $(R_{i3}+R_{f3})/R_{i3}$ in the high frequency limit. Without this second feed back loop, the standard technique to obtain a high pass function is to place a large electrolytic capacitor in the gain path, either replacing, or in series with, the input resistor $R_{i3}$ 153. As discussed in the Background section, the use of such a capacitor has several disadvantages. Second, it supplies "auto-zero feedback", canceling the DC level of the previous section and referencing the signal to the new baseline of $V_{ref2}$. Any offset voltages from the sample and hold section are thus eliminated instead of being amplified. Here, "auto-zero feedback" refers to setting the zero frequency level, which may or may not be ground since this level is set to zero only for the choice of $V_{ref2}=0$. Additionally, as the standard frequency independent gain supplied through the first feed back loop, $R_{f3}/R_{i3}$, multiplies $V_{in}$, this allows the overall gain of section $A_{out}$ 150 to be adjusted largely independently of both the characteristics of the filter function in the brackets and the new baseline level.

The middle stage in FIG. 2 is the sample and hold section S/H 120. This stage has a geometry similar to subsequent stage $A_{out}$ 150. The input from the preceding stage is again received into the inverting input of op-amp 121, but now through switch $S_1$ 125, and capacitor $C_{hold}$ 124 is in the first feedback loop into this input. The second, auto-zero feedback loop again contains an integrator $I_{fs}$ 140 with offset voltage $V_{ref1}$.

By placing capacitor $C_{hold}$ 124 in the feedback loop, stage S/H 120 functions as an integrator type sample and hold circuit. When switch $S_1$ 125 is closed during track mode, the circuit acts as a filter and accumulates charge on $C_{hold}$ 124. In hold mode, $S_1$ 125 is open and the voltage at the inverting input is proportional to the integrated charge on $C_{hold}$ 124 accumulated while $S_1$ 125 was open. As with the circuit of FIG. 1a, $Q_{hold}$ is again proportional $(-R_{f2}/R_{i2})(V_{ins}/H-V_{+S/H})$, where in this expression $V_{inS/H}$ is input voltage to S/H 120 through $R_{i2}$ and $V_{+S/H}$ is the voltage into the non-inverting input of op-amp 121; but, as the non-inverting input is now from $I_{fs}$ 140, the difference of these two values in $Q_{hold}$ again re-references the DC level during the hold mode. the switch $S_1$ 125 is controlled by the sampling signal, here denoted as $V_{sam}$, which typically has a hold phase comprising only a small portion of its total period.

The resistor $R_{f2}$ 122 is placed in parallel with $C_{hold}$ 124 in the first feedback loop, but connected with switch $S_1$ 125 in the path back to the input of op-amp 121. Including this resistor in the loop allows the gain of the sample and hold stage to be set and alters the transfer function of the stage. As some applications of sample and hold circuits require a high gain and particular frequency pass characteristics, this feedback resistor is used to set these properties, as discussed in the example below. Switch $S_2$ 126 is connected to ground, so that it can be closed during hold mode to minimize signal feed through. Both of switches $S_1$ 125 and $S_2$ 126 are controlled by the signal $V_{sam}$, $S_1$ 125 directly and $S_2$ 126 through an inverter, so that they function in unison by having $S_1$ 125 closed and $S_2$ 126 open during sample mode and the other way around during hold mode which usually comprises the much greater part of $V_{sam}$'s period. Finally, the signal from the previous stage passes through an input resistor $R_{i2}$ 123 before reaching these switches.

In sample mode, when switch $S_1$ 125 is closed and switch $S_2$ 126 is open, section S/H 120 will have the same transfer function as given above for $A_{out}$ 150 in equation (A), but with $R_f$ replaced by the parallel impedance of $R_{f2}$ 122 and $C_{hold}$ 124: $R_{f2} \rightarrow R_{f2}(1+sR_{f2}C_{hold})^{-1}$. Although the inverting feedback loop is the same as the circuit of FIG. 1a, the transfer function is no longer that of a low pass filter due to the $[s\alpha/(s\beta+1)]$ factor now multiplying $V_{in}$ from the lower, auto-zero feedback loop. As this term again goes to zero for zero frequency, the DC component is again removed. The second term in (A) again references the signal to a new baseline value of $V_{ref1}$. The lower feedback loop with integrator $I_{fs}$ 140 therefore functions as in section $A_{out}$ 150, but has several additional advantages when incorporated into a sample and hold section as done here. In some prior art designs, integrators have been included in a feedback loop to alter the DC level of the output signal, but the hold capacitor has been part of this same feedback loop. By splitting the functions into separate feedback loops, one for the auto-zero function and one for the hold capacitor, the circuit can be made more flexible in addition to executing this individual functions better by adjusting the independent parameters in (A): $V_{ref1}$, $\alpha_1 = C_{az1}R_{az1}$, $(R_{f2}R_{i2})$, and $C_{hold}R_{f2}$.

In the embodiment of FIG. 2, the sample and hold stage S/H 120 receives its input from an initial amplification stage $A_{in}$ 110. This first section is composed of an op-amp 111 that receives the initial circuit input $V_{in}$ into its non-inverting input. The inverting input is shown connected to ground through a resistor $R_{i1}$ 113 and is also connected in a feedback loop through resistor $R_{f1}$ 112. The gain of this stage is therefore $(1+R_{f1}/R_{i1})$.

Finally, the output of the third stage $A_{out}$ 150 is shown passing through a passive high-pass filter consisting $R_{out}$ 171 and $C_{out}$ 172. As with the stages $A_{in}$ 110 and $A_{out}$ 150, this element is not required for the function of the sample and hold circuit but is included for the specific example now described.

In this example, $V_{in}$ is taken to have a peak voltage of from 0.5–1 volts in which is embedded a signal in the frequency range of 10 Hz to 1 kHz with an amplitude of from 25 $\mu$V to 75 $\mu$V. For simplicity, the circuit is taken to operate between ground and a $V_{dd}$ of around 5V. The circuit needs to extract this embedded signal from, say, a microwave transducer or other source and amplify it sufficiently to be usable as an output, requiring a gain of around 90–103 dB.

The first stage $A_{in}$ 110 acts as a buffer and reduces the gain requirements of the later stages. Its gain is give by $(1+R_{f1}R_{i1})$ and amplifies both the DC level and the embedded signal. This gain can either be variable or fixed depending on the application of the circuit. For the example, as the peak voltage is 0.5–1V and $V_{dd} \approx 5V$, a gain of 2–4 will place the input voltage in the middle of the operating range. Depending on implementation, values for $R_{f1} \approx 2R_{i1}$ of 21–63 k$\Omega$ are reasonable to keep power dissipation down. This amplified signal is then passed on to the sample and hold stage S/H 120.

Figure 3A:
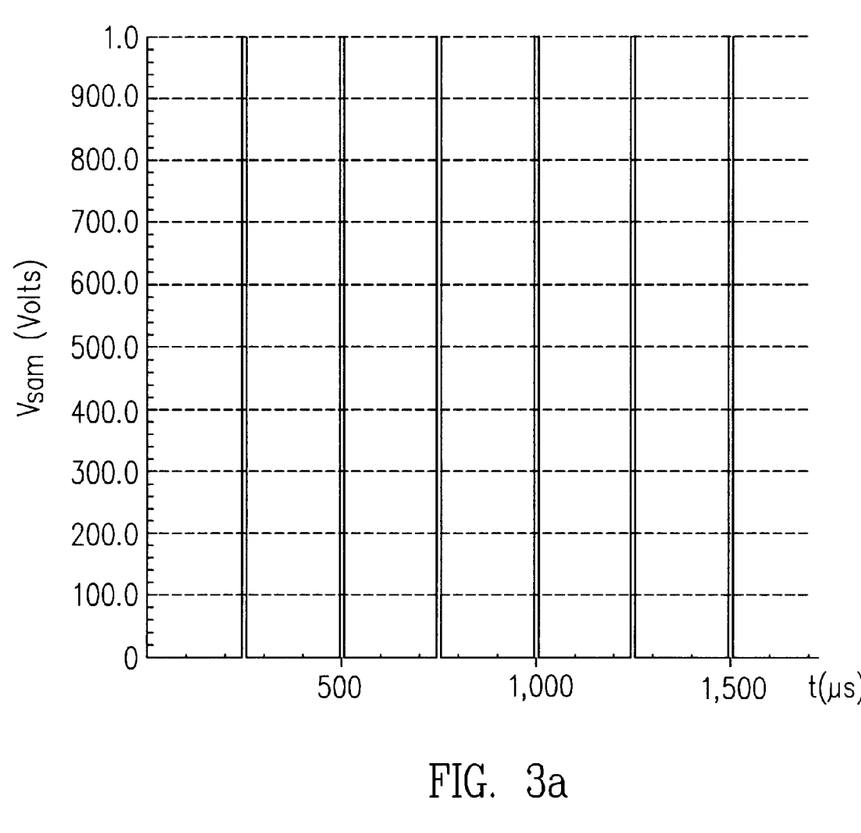
FIGS. 3a, 3b, and 3c show exemplary waveforms for $V_{sam}$, $V_{in}$, and $V_{out}$ respectively.

In S/H 120, the signal first passes through $R_{i2}$ 123 and then on to switches $S_1$ 125 and $S_2$ 126. These switches are preferable implemented using some type FET technology to minimize any offset biases. The are controlled by a signal $V_{sam}$ and arranged so that in the sample mode $S_1$ 125 is on and $S_2$ 126 is off, while in the hold mode $S_2$ 126 is on and $S_1$ 125 is off. As described above, in this way the capacitor $C_{hold}$ 124 integrates the input voltage from $A_{in}$ 110 during the hold stage and minimizes signal feedthrough during the hold stage. For the example, $V_{sam}$ is taken to be a pulse 7 $\mu$s wide and to repeat every 250 $\mu$s, as shown in FIG. 3a. (The scale of the axes differ from both of FIGS. 3b and 3c below.) This results in a sampling frequency several times higher than the upper end of the frequency range needing to be extracted and consequently above the corresponding Nyquist frequency. For the $V_{sam}$ shown in FIG. 3a repeats every 250 $\mu$s, corresponding to a sampling frequency of 4 kMz. Depending on the type and frequency of the signal being extracted, the sampling frequency is chosen accordingly, but keeping the sample mode much shorter than the hold mode. Although the waveform for $V_{sam}$ in FIG. 3a is shown with an amplitude of 1 V, this value is not critical so long as it is sufficient to operate the switches $S_1$ 125 and $S_2$ 126.

When in sample mode, the transfer function of S/H 120 is given by equation (A), but with $R_f$ replaced by the parallel combination of $R_{f2}$ 122 and $C_{hold}$ 124. In hold mode, the output of S/H is set by the charge integrated on $C_{hold}$ 124 due to the voltage input from $A_{in}$ 110, but with the DC level of that section cancelled and referenced to the new baseline $V_{ref1}$. Thus, if configured for unity gain, the hold output would just be $V_{in}$ with the DC level set to $V_{ref1}$. For the exemplary application, the values of $R_{f2} \approx 400$ k$\Omega$, $R_{i2} \approx 2$ k$\Omega$, $R_{az1} \approx 5$ M$\Omega$, $C_{az1} \approx 0.3$ $\mu$F, and $C_{hold} \approx 25$–100 pf give the appropriate filter characteristic over 10–1000 Hz and result in a gain of around 115 over this frequency range. More generally, $R_i$ is taken to be above 1 k$\Omega$ or so to limit power dissipation and the relative value of $R_f$ picked to set the amount gain desired. $R_{az}$ and $C_{az}$ can then be taken to adjust filter pole. To increase flexibility, $C_{az1}$ (and possibly also $R_{az1}$) can be off-chip allowing the user to set the filter characteristics according to the application. The value of $C_{hold}$ is taken as reasonable size so that leakage is not a concern, but small enough to not use up too much chip area.

A convenient choice for $V_{ref1}$ is $\frac{1}{2}V_{dd}$, or, more generally $\frac{1}{2}(V_{high}-V_{low})$ for a device operating between logic values $V_{high}$ and $V_{low}$, as this choice places the output in the center of the operating range to minimize the possibility of saturation on the extracted signal. This choice can itself be offset to compensate for offset voltages in the components of S/H 120. $V_{ref1}$ can be set by a resistive voltage divider or other standard technique. In alternate embodiments it can be made adjustable if this feature is useful for later stages of the circuit.

The output of S/H 120 will then consist of the time varying portion of $V_{in}$, which has been extracted, amplified with a gain of 300–400, and re-referenced to the DC level $V_{ref1}$. For the example, the smallness of the embedded signal requires more amplification and the third stage $A_{out}$ 150 provides the additional gain.

The parameters in $A_{out}$ 150 are here taken to be the same as the corresponding values in S/H 120 and for the same reasons: $R_{f3} \approx 400$ k$\Omega$, $R_{i3} \approx 2$ k$\Omega$, $R_{az2} \approx 5$ M$\Omega$, and $C_{az2} \approx 0.3$ $\mu$F. This allows the required gain to be fairly evenly split between $A_{out}$ 150 and S/H 120, each stage producing a gain of around 115 over the frequency range. Although this arrangement is often convenient, as the amplification duties are evenly split and it allows for duplication of components, in other applications it may be advantageous to set the parameters in $A_{out}$ 150 differently form S/H 120. The differences due to the additional sample and hold function of S/H 120, and the introduction of the switches and $C_{hold}$ because of them, may require parameter changes in S/H 120 relative to $A_{out}$ 150. For example, a particular application of the circuit of FIG. 2 may require a value of $C_{hold}$ 124 that would result in the other parameters S/H 120 needing to be adjusted with respect to those in $A_{out}$ 150.

For the same reasons as given above with respect to $V_{ref1}$, a convenient choice for many applications $V_{ref2}$ is $V_{ref2} = \frac{1}{2}V_{dd}$. However, depending what the ultimate use to which $V_{out}$ will be put, $V_{ref2}$ can be set to a different value from $V_{ref1}$ at whatever reference level is appropriate. For example, a given application may need the extracted signal referenced to ground. In a more general embodiment, $V_{ref2}$ is adjustable to make its output less application dependent.

Finally, the signal passes through $R_{out}$ 171 and $C_{out}$ 172. This acts as a low pass filter to skim off any high frequency noise. For the example, the values $R_{out} \approx 1$ kΩ and $C_{out} \approx 0.1$ $\mu$F are suitable. As with the auto-zero feedback loops, this capacitor and also possibly resistor can be off chip to increase flexibility.

Figure 3B:
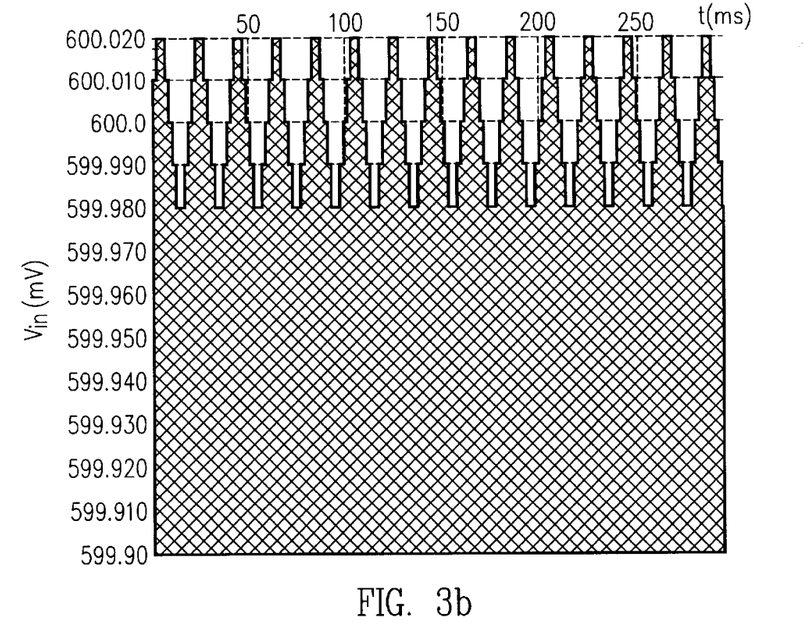
Figure 3C:
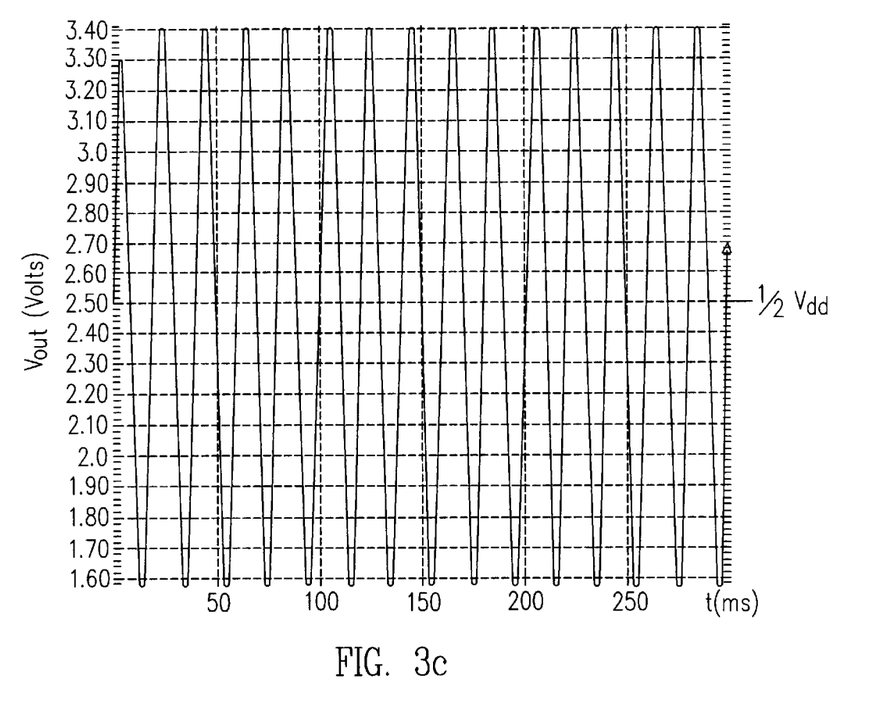

Exemplary waveforms for $V_{out}$ and $V_{in}$ for these values are respectively shown in FIGS. 3c and 3b. FIG. 3b shows a sine wave having a frequency of 50 Hz and amplitude of 20 $\mu$V embedded in a 0.6V DC voltage. (Note that the $V_{in}$ axis begins at 599.90 mV.) The resultant $V_{out}$ is shown in FIG. 3c as having the same frequency as the embedded sine wave, but with an amplitude of 0.9V and a DC level of 2.5V, the offset of $V_{in}$ having been removed and set to the new reference level of $\frac{1}{2}V_{dd}$.

The circuit of FIG. 2 can be readily implemented on a single integrated circuit since it does not require the sort of large, off-chip capacitors needed in the gain path of the prior art described in the Background section to obtain a high gain, high pass sample and hold system. This circuit can be implemented as a CMOS circuit or, more generally, in any of the other standard technologies (BiCMOS, GaAs, SiGe, and so on). In this way, the reliability problems associated with discrete solutions—board leakage around the sample and hold FET, failure of the large electrolytic capacitors in the gain path, susceptibility of these capacitors to induced electromagnetic fields—are avoided. Additionally, the described solution reduces both board area and the number of components and allows a manufacturing flow using only surface mount components.

In other embodiments, it may be preferable to place the integrating capacitors ($C_{az1}$ 142 and $C_{az2}$ 162 of FIG. 2) and possibly also the input resistors ($R_{az1}$ 143 and $R_{az2}$ 163) for the auto-zero feedback loop off-chip. In this way, these elements can be chosen to set the filter characteristics to the particular application where the circuit is used. Otherwise, the circuit is restricted to the filter profile set when it is manufactured. Also, for the example used above where the desired frequencies run from 10 Hz to 1 kHz, values of $C_{az} \approx 0.3$ $\mu$F and $R_{az} \approx 5$ MΩ are used. A capacitor of this size would require a large amount of chip area and is therefore generally placed off-chip. Similarly, for reasons of flexibility and reduced chip size, $C_{out}$ 172 is preferably not included on the chip for embodiments having the auto-zero capacitors off-chip.

Although these last embodiments may result in off-chip capacitors, these differ in both a qualitative and quantitative way from those placed in the gain path as found in the prior art. To meet the requirements of the given example, where a gain of several orders of magnitude is required starting from as low as 10 Hz while still eliminating the DC component, the sort of prior art designs described in the background section utilize capacitors with values in the range of 10 $\mu$F. Using smaller values would require unreasonable resistor values and likely lead to circuit leakage problems. Also, to obtain a capacitance of that size, the capacitors take up considerable area on a printed circuit board and are generally tantilum/electrolytic devices. This sort of device is usually found to be less reliable due the chemical nature the dielectric material. In the embodiments of the previous paragraph, the values used for $C_{az1}$ 142 and $C_{az2}$ 162 are one or two orders of magnitude smaller and consequently avoid these problems.

Various details of the implementation and method are merely illustrative of the invention. It will be understood that various changes in such details may be within the scope of the invention, which is to be limited only by the appended claims.

What is claimed is:

1. A circuit to sample and hold a signal, comprising:
    a first amplifier having a first input, a second input, and an output;
    a first switch connected to said first input through a first node and to said signal through a second node, whereby said signal is supplied to said first input when the switch is closed;
    a first feedback loop between said output and said first input, comprising:
        a capacitor connected to said first input through said first node;
    a second feedback loop between said output and said second input, comprising:
        an integrator having a first predetermined offset voltage.

2. The circuit of claim 1, wherein said first feedback loop further comprises:
    a first resistor in parallel to said capacitor connected to said first input through said second node.

3. The circuit of either of claims 1 or 2, wherein said integrator is comprised of:
    a second amplifier having two inputs and an output, wherein the output of said second amplifier is connected to the second input of said first amplifier, and wherein said predetermined offset voltage is connected to a first of the two inputs of said second amplifier;
    a second resistor connected between the output said first amplifier and a second one of the two inputs of said second amplifier; and
    a feedback loop containing a capacitor from the output of said second amplifier to the second one of the two inputs of said second amplifier.

4. The circuit of claim 3, further comprising:
    a second switch connected between said second node and a predetermined voltage.

5. The circuit of claim 4, wherein said first and second switches are connected to a control signal, whereby when said first switch is closed in response to the control signal, said second switch is open, and whereby when said first switch is open in response to the control signal, said second switch is closed.

6. The circuit of claim 5, wherein said circuit, except for said capacitor from the output of said second amplifier to the second one of the two inputs of said second amplifier and said second resistor, is formed as part of a single integrated circuit.

7. The circuit of claim 6, wherein said first and second switches are formed from FET transistors.

8. The circuit of claim 2, further comprising:
a preliminary amplification stage connected to receive said signal; and
a third resistor connected between the preliminary amplification stage and said second node, whereby said signal is supplied to said second node by the preliminary amplification stage through said third resistor.

9. The circuit of claim 2, further comprising:
a third amplifier having a first input, a second input, and an output;
a fourth resistor connected between the output of said first amplifier and the first input of said third amplifier;
a first feedback loop between the output of said third amplifier and the first input of said third amplifier, wherein said loop includes a fifth resistor; and
a second feedback loop between the output of said third amplifier and the second input of said third amplifier, comprising:
an integrator having a second predetermined offset voltage.

10. The circuit of claim 2, further comprising:
a preliminary amplification stage connected to receive said signal;
a third resistor connected between the preliminary amplification stage and said second node, whereby said signal is supplied to said second node by the preliminary amplification stage through said third resistor;
a third amplifier having a first input, a second input, and an output;
a fourth resistor connected between the output of said first amplifier and the first input of said third amplifier;
a first feedback loop between the output of said third amplifier and the first input of said third amplifier, wherein said loop includes a fifth resistor; and
a second feedback loop between the output of said third amplifier and the second input of said third amplifier, comprising:
an integrator having a second predetermined offset voltage.

11. The circuit of either one of claim 8 or claim 9, wherein said integrator having a second predetermined offset voltage is comprised of:
a fourth amplifier having two inputs and an output, wherein the output of said fourth amplifier is connected to the second input of said third amplifier, and wherein said second predetermined offset voltage is connected to a first of the two inputs of said fourth amplifier;
a fifth resistor connected between the output said third amplifier and a second one of the two inputs of said fourth amplifier; and
a feedback loop containing a capacitor from the output of said fourth amplifier to the second one of the two inputs of said fourth amplifier.

12. The circuit of claim 11, wherein said circuit, except for said capacitor from the output of said second amplifier to the second one of the two inputs of said second amplifier, said second resistor, said capacitor from the output of said fourth amplifier to the second one of the two inputs of said fourth amplifier and said fifth resistor, is formed as part of a single integrated circuit.

13. A method for extracting a time varying component of an analog signal, comprising:

supplying the analog signal to a circuit including a sample and hold section, wherein said sample and hold section comprises an op-amp having a first feedback loop with a charge holding element and a second feedback loop connected to a first predetermined reference voltage; and
alternately sampling and holding said analog signal in said sample and hold section, wherein said sampling comprises:
producing an output signal derived from said time varying component, wherein said output signal has a DC level determined by said first predetermined reference voltage and which is independent of the DC level of said analog signal; and
setting a charge level in said charge holding element proportional to said output signal derived from said from time varying component; and
wherein said holding comprises:
producing an output signal determined by said charge level.

14. The method of claim 13, wherein said sample and hold section has a high gain function.

15. The method of claim 14, further comprising:
amplifying said output signal through use of a high gain high pass filter.

16. The method of claim 15, wherein said high gain high pass filter re-references said output to a second predetermined reference voltage.

17. The method of either of claims 14 or 16, further comprising:
amplifying said analog input voltage prior to supplying said input voltage to a sample and hold section.

18. The method of claim 17, wherein amplifying said analog input voltage prior to supplying said input voltage to a sample and hold section is through use of a variable gain amplifier section.

19. The method of claim 17, wherein said the DC level of said analog signal has an amplitude more than $10^3$ greater than said time varying component.

20. The method of any of claims 13, 14 or 16, wherein said time varying component has a frequency in the range of from 10 Hz to 1,000 Hz.

21. An integrated circuit comprising:
a high-gain sample and hold section having an externally connectable input and having an output supplying an intermediate signal, wherein the sample and hold section references the DC level of said intermediate signal to a first predetermined level independent of the DC level of an externally input analog signal through use of a feedback loop connecting to a first external capacitor and a first external resistor; and
a high-gain high pass filter section having an externally accessible output signal and an input connected to said intermediate signal, wherein the filter section references the DC level of its output signal to a second predetermined level independent of the DC level of said first predetermined level through use of a feedback loop connecting to a second external capacitor and a second external resistor.

22. The integrated circuit of claim 21, further comprising:
an amplifier section whose output is connected the input of said sample and hold section for supplying said externally input analog signal.

23. The integrated circuit of claim 22, wherein said amplifier section is of adjustable gain.

24. The integrated circuit of claim 21, wherein the sample and hold section has a band pass function for passing a first range of frequencies.

25. The integrated circuit of claim 24, wherein said first range of frequencies is from 10 Hz to 1,000 Hz.

26. The integrated circuit of claim 24, wherein the gain of the sample and hold section over said first range of frequencies is greater than 100.

27. The integrated circuit of claim 21, wherein the gain of the filter section for frequencies above a first frequency is greater than 100.

28. The integrated circuit of claim 27, wherein said first frequency is 10 Hz.

29. A sample and hold circuit for receiving an analog voltage through an input, comprising:
- a high gain sample and hold stage comprising a first op-amp non-capactively coupled to said input, wherein the output of said sample and hold circuit is independent of any DC portion of said analog voltage; and
- a high gain high pass filter stage comprising a second op-amp whose input is non-capacitively coupled to the output of said sample and hold circuit.

30. The sample and hold circuit of claim 29, wherein the sample and hold stage references its output to a first predetermined level.

31. The sample and hold circuit of claim 30, wherein the filter stage has an output referenced to a second predetermined level independent of said first predetermined level.

32. The sample and hold circuit of claim 30, wherein the gain of said filter stage references above a first frequency is greater than 100.

33. The sample and hold circuit of claim 32, wherein said first frequency is 10 Hz.

34. The sample and hold circuit of claim 30, wherein the sample and hold stage has a band pass function for passing a first range of frequencies.

35. The sample and hold circuit of claim 34, wherein said first range of frequencies is from 10 Hz to 1,000 Hz.

36. The sample and hold circuit of claim 34, wherein the gain of the sample and hold stage over said first range of frequencies is greater than 100.

37. The sample and hold circuit of claim 29, further comprising:
- an amplifier connected between said input and the sample and hold stage.

* * * * *